(12) United States Patent
Chin

(10) Patent No.: US 8,242,607 B2
(45) Date of Patent: Aug. 14, 2012

(54) INTEGRATED CIRCUIT PACKAGE SYSTEM WITH OFFSET STACKED DIE AND METHOD OF MANUFACTURE THEREOF

(75) Inventor: Chee Keong Chin, Shanghai (CN)

(73) Assignee: Stats Chippac Ltd., Singapore (SG)

( * ) Notice: Subject to any disclaimer, the term of this patent is extended or adjusted under 35 U.S.C. 154(b) by 819 days.

(21) Appl. No.: 11/950,216

(22) Filed: Dec. 4, 2007

(65) Prior Publication Data

US 2008/0150158 A1 Jun. 26, 2008

Related U.S. Application Data

(60) Provisional application No. 60/871,134, filed on Dec. 20, 2006.

(51) Int. Cl.
*H01L 23/48* (2006.01)
*H01L 23/52* (2006.01)
*H01L 29/40* (2006.01)

(52) U.S. Cl. .............. 257/777; 257/686; 257/E21.499; 438/107; 438/109

(58) Field of Classification Search .............. 257/777, 257/686, 784, E23.172, E23.169, E21.499; 438/107, 109
See application file for complete search history.

(56) References Cited

U.S. PATENT DOCUMENTS

| | | | |
|---|---|---|---|
| 5,793,108 A * | 8/1998 | Nakanishi et al. | 257/723 |
| 6,514,794 B2 | 2/2003 | Haba et al. | |
| 6,552,423 B2 * | 4/2003 | Song et al. | 257/679 |
| 6,900,528 B2 | 5/2005 | Mess et al. | |
| 7,057,269 B2 * | 6/2006 | Karnezos | 257/686 |
| 7,262,506 B2 | 8/2007 | Mess et al. | |
| 7,352,057 B2 * | 4/2008 | Grafe et al. | 257/686 |
| 2005/0029645 A1 | 2/2005 | Mess et al. | |
| 2006/0267173 A1 * | 11/2006 | Takiar et al. | 257/686 |
| 2007/0065987 A1 | 3/2007 | Mess et al. | |
| 2007/0085184 A1 * | 4/2007 | Kwon et al. | 257/686 |
| 2007/0194462 A1 * | 8/2007 | Kim et al. | 257/787 |

FOREIGN PATENT DOCUMENTS

| | | |
|---|---|---|
| JP | 2001217383 A | 8/2001 |
| JP | 2001298150 A | 10/2001 |
| JP | 2002359346 A | 12/2002 |
| JP | 2006313798 A | 11/2006 |

\* cited by examiner

*Primary Examiner* — Shouxiang Hu

(74) *Attorney, Agent, or Firm* — Ishimaru & Associates LLP; Mikio Ishimaru; Stanley Chang

(57) ABSTRACT

A method of manufacture of an integrated circuit package system comprises: providing a first integrated circuit die; attaching a second integrated circuit die over the first integrated circuit die and offset from the first integrated circuit die in substantially one dimension; forming an interdie layer over the second integrated circuit die; attaching a third integrated circuit die over the interdie layer and substantially aligned to the second integrated circuit die; and attaching a fourth integrated circuit die over the third integrated circuit die and offset from the third integrated circuit die in substantially the same magnitude and substantially the opposite direction as the second integrated circuit die to the first integrated circuit die.

19 Claims, 2 Drawing Sheets

INTEGRATED CIRCUIT PACKAGE SYSTEM WITH OFFSET STACKED DIE AND METHOD OF MANUFACTURE THEREOF

CROSS-REFERENCE TO RELATED APPLICATION(S)

This application claims the benefit of U.S. Patent Application Ser. No. 60/871,134 filed Dec. 20, 2006, and the subject matter thereof is hereby incorporated herein by reference thereto.

TECHNICAL FIELD

The present invention relates generally to integrated circuit packages and more particularly to a system for integrated circuit packages with stacked die.

BACKGROUND ART

Electronic products have become an integral part of our daily lives. Notably, many portable electronics with complex integrated circuits are not only common but also often utilized without the slightest thought about the underlying technology. Many products such as cell phones, portable computers, voice recorders, cars, planes, etc. include very sophisticated technology.

With virtually all functions and purposes for which we use these products, there continues to be demand for new features, speed, data, or portability. These demands continually drive the electronics industry to reduce the size, improve the utility, and increase the performance of the integrated circuit devices contained within these products to which we have become accustomed.

In order to interface an integrated circuit with other circuitry, it is common to mount it on a lead frame or substrate. Each integrated circuit has bonding pads that are individually connected to the lead frame's lead finger pads using extremely fine gold or aluminum wires. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate and the size of the packages.

Even larger form factor systems, such as PC's, computer servers, and storage servers, need more integrated circuits in the same or smaller "real estate". In particular, the need for portable personal electronics, such as cell phones, digital cameras, music players, PDA's, and location-based devices, has further driven the need for integrated circuit density.

This need for increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of a PCB substrate onto which a set of separate integrated circuit components is directly attached. Such multi-chip packages have been found to increase integrated circuit density and miniaturization, improve signal propagation speed, reduce overall integrated circuit size and weight, improve performance, and lower costs—all primary goals of the computer industry.

There continue to be limitations on the number of die that can be stacked in a package. Same die stacking with all bond pads at one side allows staircase stacking eliminating the need for thick spacers between the dies. However, stacking is still restricted by the package size where over-stacking cause die protrusion requiring extra long packages.

Despite the advantages of recent developments in integrated circuit and integrated circuit package manufacturing, there is a continuing need for improving integrated circuit device and integrated circuit package connectivity and stacking to provide improved density as well as structural integrity, manufacturing yield, and product reliability.

Thus, a need still remains for an integrated circuit package system to provide improved die stacking and dimensions. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including providing a first integrated circuit die; attaching a second integrated circuit die over the first integrated circuit die and offset from the first integrated circuit die in substantially one dimension; forming an interdie layer over the second integrated circuit die; attaching a third integrated circuit die over the interdie layer and substantially aligned to the second integrated circuit die; and attaching a fourth integrated circuit die over the third integrated circuit die and offset from the third integrated circuit die in substantially the same magnitude and substantially the opposite direction as the second integrated circuit die to the first integrated circuit die.

The present invention provides a first integrated circuit die; a second integrated circuit die over the first integrated circuit die and offset from the first integrated circuit die in substantially one dimension; an interdie layer over the second integrated circuit die; a third integrated circuit die over the interdie layer and substantially aligned to the second integrated circuit die; and a fourth integrated circuit die over the third integrated circuit die and offset from the third integrated circuit die in substantially the same magnitude and substantially the opposite direction as the second integrated circuit die to the first integrated circuit die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
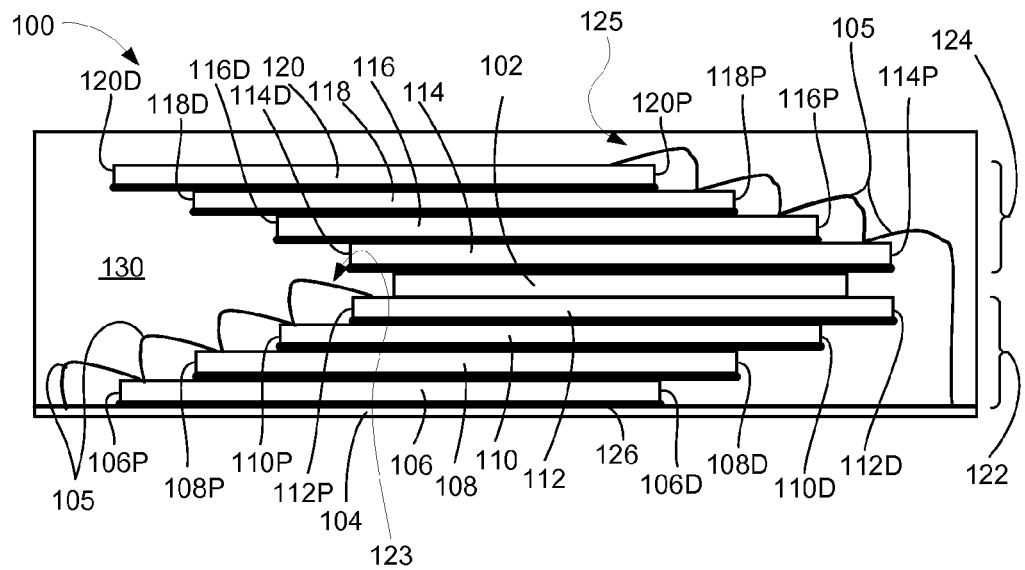
FIG. 1 is a side view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used. The term "proximal" means nearest or proximate the point of origin and the term "distal" means the opposite of "proximal" or furthest away from the point of origin.

Referring now to FIG. 1, therein is shown a side view of an integrated circuit package system 100 in a first embodiment of the present invention. The integrated circuit package system 100 preferably includes an interdie layer 102 particularly for substantially aligned, adjacent die. The interdie layer 102 can provide spacing, structural integrity, isolation, or conductivity for substantially aligned, adjacent die.

A substrate 104 such as a support structure, a lead frame, a die pad, or a ball grid array substrate can provide a mounting surface for a first integrated circuit die 106 having an interconnect proximal side 106P proximal, or adjacent, to an interconnect 105 and an interconnect distal side 106D distal, or away, from the interconnect 105. A second integrated circuit die 108 has an interconnect proximal side 108P proximal to the interconnect 105 and an interconnect distal side 108D distal from the interconnect 105. The second integrated circuit die 108 with the interconnect proximal side 108P offset in a first direction by a first distance from the interconnect proximal side 106P can be mounted over the first integrated circuit die 106. A third integrated circuit die 110 has an interconnect proximal side 110P proximal to the interconnect 105 and an interconnect distal side 110D distal from the interconnect 105. The third integrated circuit die 110 with the interconnect proximal side 110P offset in the first direction by the first distance from the interconnect proximal side 108P can be mounted over the second integrated circuit die 108.

Similarly a fourth integrated circuit die 112 has an interconnect proximal side 112P proximal to the interconnect 105 and an interconnect distal side 112D distal from the interconnect 105. The fourth integrated circuit die 112 with the interconnect proximal side 112P offset in the first direction by the first distance from the interconnect proximal side 110P can be mounted over the third integrated circuit die 110. A fifth integrated circuit die 114 has an interconnect proximal side 114P proximal to the interconnect 105 and an interconnect distal side 114D distal from the interconnect 105. The fifth integrated circuit die 114 with the interconnect proximal side 114P substantially aligned with the interconnect distal side 112D can be mounted over the interdie layer 102. The interdie layer 102 can be recessed from the interconnect proximal side 112P of the fourth integrated circuit die 112 and the interconnect proximal side 114P of the fifth integrated circuit die 114 and formed having planar dimensions less than or equal to planar dimensions of the fourth integrated circuit die 112 or the fifth integrated circuit die 114.

A sixth integrated circuit die 116 has an interconnect proximal side 116P proximal to the interconnect 105 and an interconnect distal side 116D distal from the interconnect 105. The sixth integrated circuit die 116 with the interconnect proximal side 116P offset in a second direction by the first distance from the interconnect proximal side 114P can be mounted over the fifth integrated circuit die 114. A seventh integrated circuit die 118 has an interconnect proximal side 118P proximal to the interconnect 105 and an interconnect distal side 118D distal from the interconnect 105. The seventh integrated circuit die 118 with the interconnect proximal side 118P offset in the second direction by the first distance from the interconnect proximal side 116P can be mounted over the sixth integrated circuit die 116.

An eighth integrated circuit die 120 having an interconnect proximal side 120P proximal to the interconnect 105 and an interconnect distal side 120D distal from the interconnect 105. The eighth integrated circuit die 120 with the interconnect proximal side 120P offset in the second direction by the first distance from the interconnect proximal side 118P can be mounted over the seventh integrated circuit die 118. A lower die stack 122 can provide a stair step or cascaded configuration. The interconnect 105 can be connected to the an upper surface near the interconnect proximal sides 106P, 108P, 110P, and 112P of the first through fourth integrated circuit dies 106, 108, 110, 112 of the lower stack 122 and can be a lower interconnect 123. An upper die stack 124 can provide a substantially opposite or mirrored stair step or cascaded configuration. The interconnect 105 can be connected to the an upper surface near the interconnect proximal sides 114P, 116P, 118P, and 120P of the first through fourth integrated circuit dies 114, 116, 118, and 120 of the upper stack 124 and can be an upper interconnect 125. The lower die stack 122 and the upper die stack 124 can form a shape of a zigzag, an angle bracket, or a chevron. The first through eighth integrated circuit dies 106, 108, 110, 112, 114, 116, 118, and 120 are all the same size and all have active surfaces facing upward, as indicated by the location of the interconnects 105 at the top of the dies.

Die can be attached to the substrate 104 or one another with an attach layer 126 such as a conductive or non-conductive adhesive. The attach layer 126 can be the same or different material for each of the die. For example the first integrated circuit die 106 can be attached over the substrate 104 with the attach layer 126 such as an epoxy and the second integrated circuit die 108 can be attached over the first integrated circuit die 106 with the attach layer 126 such as an epoxy or adhesive film.

The first integrated circuit die 106 can be electrically connected to the substrate 104 by the interconnect 105, such as a bond wire, planar interconnect, or conductive ball. The interdie layer 102 can allow the interconnect 105 over the fourth integrated circuit die 112 to include a loop height higher than a height or thickness of the fourth integrated circuit die 112.

In addition to the material or technology, the interconnect 105, or multiple interconnects 105, can provide multiple levels or modes of connectivity such as to different dies in the same stack, commonly connected to the support structure, or individually connected to the substrate 104. The interconnect 105 can provide electrical connectivity for electrical signals or electrical levels for the integrated circuit package system 100.

For illustrative purposes, the integrated circuit package system 100 is shown having a shape of a zigzag, an angle bracket, or a chevron although it is understood that any offset configuration may be used. Further, any number of die, the interdie layer 102, offset directions, or directional changes may be used and thereby add significantly more function in a limited space particularly where space is at a premium.

It has been discovered that the integrated circuit package system 100 with offset stacked die allows having at least fifty percent (50%) more stacking dies within a package form factor and allows the interconnect 105 having a loop height higher that a die height or thickness. Further, the stacking method of the present invention prevents die protrusion from a single package encapsulant 130 and thus allows more die such as eight or more die to be stacked within a package. The single package encapsulant 130 is in direct contact with first through eighth integrated circuit dies 106, 108, 110, 112, 114, 116, 118, and 120 and in direct contact with the interdie layer 102.

Figure 2:
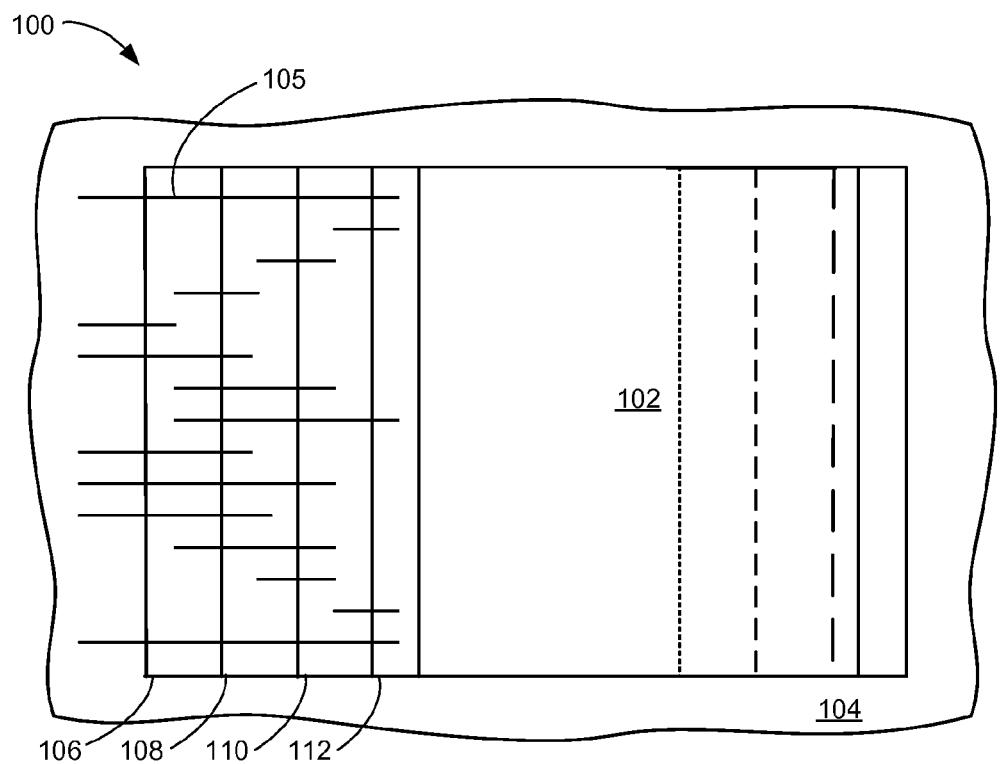
FIG. 2 is a top plan view of the integrated circuit package system in a die attachment phase.

Referring now to FIG. 2 therein is shown a top plan view of the integrated circuit package system 100 in a die attachment phase. The first integrated circuit die 106 can be mounted over the substrate 104. The second integrated circuit die 108 can be mounted over the first integrated circuit die 106 and offset from the first integrated circuit die 106 in substantially one dimension such as a horizontal offset to a left side.

Similarly the third integrated circuit die 110 can be mounted over the second integrated circuit die 108 and offset from the second integrated circuit die 108 in substantially the same direction or substantially the same magnitude as the second integrated circuit die 108 to the first integrated circuit die 106. The mounting or attaching provides the stair step or cascaded configuration shown in FIG. 1.

Further the fourth integrated circuit die 112 can be mounted over the third integrated circuit die 110 and offset from the third integrated circuit die 110 in substantially the same direction or substantially the same magnitude as the third integrated circuit die 110 to the second integrated circuit die 108. The mounting or attaching continues the stair step or cascaded configuration shown in FIG. 1.

The interdie layer 102 can be applied over the fourth integrated circuit die 112 having planar dimensions less than planar dimensions of the fourth integrated circuit die 112 or the fifth integrated circuit die 114. Planar dimensions of the interdie layer 102 provide spacing for the interconnect 105 to attach over the fourth integrated circuit die 112 and without contacting the fifth integrated circuit die 114 of FIG. 1.

The top view shows four rectangular die offset from one another with the interdie layer 102 over the top rectangular die. For illustrative purposes the four die are shown having substantially the same dimensions although it is understood that the dies may be have any size and any shape for optimization including overall package size and for any given selection of die.

Further, for illustrative purposes the interconnect 105 are shown as bond wires connected over active sides of the dies wherein the die immediately above is offset from the connected die although the use of bond wires does not exclude the use of conductive balls between the die wherein the die may have facing active faces such as with the use of flip chip die.

Figure 3:
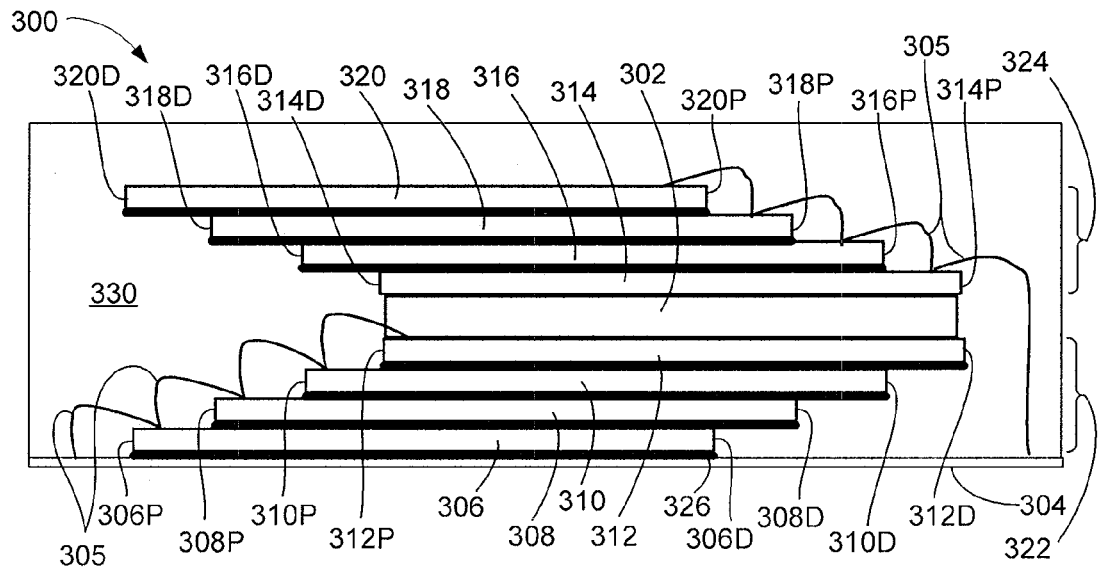
FIG. 3 is a side view of an integrated circuit package system in a second embodiment of the present invention.

Referring now to FIG. 3, therein is shown a side view of an integrated circuit package system 300 in a second embodiment of the present invention. Similar to the integrated circuit package system 100, the integrated circuit package system 300 preferably includes an interdie layer 302 such as a wire in film technology. The interdie layer 302 can provide spacing, structural integrity, or isolation for substantially aligned, adjacent die.

A substrate 304 such as a support structure, a lead frame, a die pad, or a ball grid array substrate can provide a mounting surface for a first integrated circuit die 306 having an interconnect proximal side 306P proximal to an interconnect 305 and an interconnect distal side 306D distal from the interconnect 305. A second integrated circuit die 308 has an interconnect proximal side 308P proximal to the interconnect 305 and an interconnect distal side 308D distal from the interconnect 305. The second integrated circuit die 308 with the interconnect proximal side 308P offset in a first direction by a first distance from the interconnect proximal side 306P can be mounted over the first integrated circuit die 306. A third integrated circuit die 310 has an interconnect proximal side 310P proximal to the interconnect 305 and an interconnect distal side 310D distal from the interconnect 305. The third integrated circuit die 110 with the interconnect proximal side 310P offset in the first direction by the first distance from the interconnect proximal side 308P can be mounted over the second integrated circuit die 308.

Similarly a fourth integrated circuit die 312 has an interconnect proximal side 312P proximal to the interconnect 305 and an interconnect distal side 312D distal from the interconnect 305. The fourth integrated circuit die 312 with the interconnect proximal side 312P offset in the first direction by the first distance from the interconnect proximal side 310P can be mounted over the third integrated circuit die 310. A fifth integrated circuit die 314 has an interconnect proximal side 314P proximal to the interconnect 305 and an interconnect distal side 314D distal from the interconnect 305. The fifth integrated circuit die 314 with the interconnect proximal side 314P substantially aligned with the interconnect distal side 312D can be mounted over the interdie layer 302. The interdie layer 302 can be formed having planar dimensions less than or equal to planar dimensions of the fourth integrated circuit die 312 or the fifth integrated circuit die 314.

A sixth integrated circuit die 316 has an interconnect proximal side 316P proximal to the interconnect 305 and an interconnect distal side 316D distal from the interconnect 305. The sixth integrated circuit die 316 with the interconnect proximal side 316P offset in a second direction by the first distance from the interconnect proximal side 314P can be mounted over the fifth integrated circuit die 314. A seventh integrated circuit die 318 has an interconnect proximal side 318P proximal to the interconnect 305 and an interconnect distal side 318D distal from the interconnect 305. The seventh integrated circuit die 318 with the interconnect proximal side 318P offset in the second direction by the first distance from the interconnect proximal side 316P can be mounted over the sixth integrated circuit die 316.

An eighth integrated circuit die 320 having an interconnect proximal side 320P proximal to the interconnect 305 and an interconnect distal side 320D distal from the interconnect 305. The eighth integrated circuit die 320 with the interconnect proximal side 320P offset in the second direction by the first distance from the interconnect proximal side 318P can be mounted over the seventh integrated circuit die 318. A lower die stack 322 can provide a stair step or cascaded configuration. An upper die stack 324 can provide a substantially opposite or mirrored stair step or cascaded configuration. The lower die stack 322 and the upper die stack 324 can form a shape of a zigzag, an angle bracket, or a chevron. The lower die stack 322 and the upper die stack 324 are encapsulated in a single package encapsulant 330. The single package encapsulant 330 is in direct contact with first through eighth integrated circuit dies 306, 308, 310, 312, 314, 316, 318, and 320 and in direct contact with the interdie layer 302. The first through eighth integrated circuit dies 306, 308, 310, 312, 314, 316, 318, and 320 are all the same size and all have active surfaces facing upward, as indicated by the location of the interconnects 305 at the top of the dies.

Die can be attached to the substrate 304 or one another with an attach layer 326 such as a conductive or non-conductive adhesive. The attach layer 326 can be the same or different material for each of the die. For example the first integrated circuit die 306 can be attached over the substrate 304 with the attach layer 326 such as an epoxy and the second integrated circuit die 308 can be attached over the first integrated circuit die 306 with the attach layer 326 such as an epoxy or adhesive film.

The first integrated circuit die 306 can be electrically connected to the substrate 304 by the interconnect 305 such as a bond wire, planar interconnect, or conductive ball. The interdie layer 302 can allow the interconnect 305 over the fourth integrated circuit die 312 to include a loop height higher than a height or thickness of the fourth integrated circuit die.

In addition to the material or technology, the interconnect 305 can provide multiple levels or modes of connectivity such as to different dies in the same stack, commonly connected to the support structure, or individually connected to the substrate 304. The interconnect 305 can provide electrical connectivity for electrical signals or electrical levels for the integrated circuit package system 300.

Further the interconnect 305 can be formed at least partially in the interdie layer 302 with a process such as wire in film technology. The interdie layer 302 can enclose a portion of the interconnect 305 to provide spacing, structural integrity, or isolation for the interconnect 305 or the substantially aligned, adjacent die. For illustrative purposes the interconnect 305 are shown as bond wires although it is understood that any connection material or technology may be used.

Figure 4:
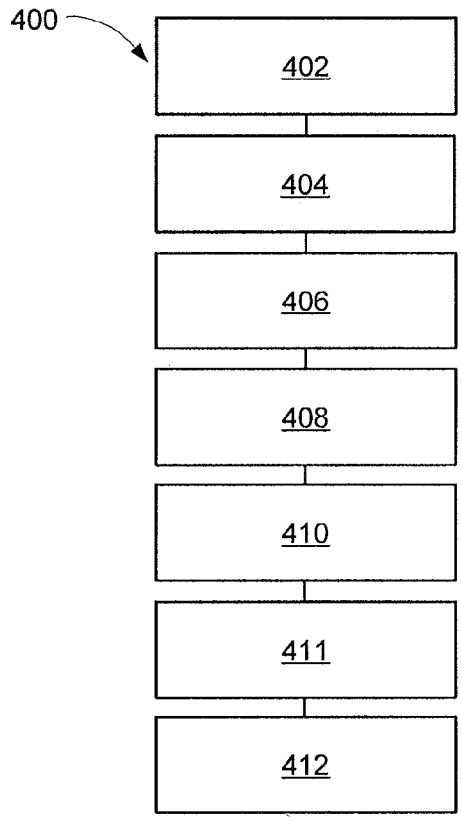
FIG. 4 is a flow chart of a method of manufacture of an integrated circuit package system in an embodiment of the present invention.

Referring now to FIG. 4, therein is shown a flow chart of an integrated circuit package system 400 for manufacturing the integrated circuit package system 100 in an embodiment of the present invention. The system 400 includes: providing a first integrated circuit die having an interconnect proximal side in a block 402; attaching a second integrated circuit die over the first integrated circuit die, the second integrated circuit die having an interconnect proximal side and an interconnect distal side, the interconnect proximal side of the second integrated circuit die offset in a first direction from the interconnect proximal side of the first integrated circuit die in a block 404; forming an interdie layer over the second integrated circuit die in a block 406; attaching a first interconnect to interconnect proximal active sides of the first and second, integrated circuit dies in a block 408; attaching a third integrated circuit die over the interdie layer, the third integrated circuit die having an interconnect distal side and an interconnect proximal side substantially aligned with the interconnect distal side of the second integrated circuit die in a block 410; attaching a fourth integrated circuit die over the third integrated circuit die, the fourth integrated circuit die having an interconnect proximal side offset in a second direction from the interconnect proximal side of the third integrated circuit die in a block 412; and attaching a second interconnect to interconnect active sides of the third and fourth integrated circuit dies in a block 414.

In greater detail, a system to provide the method and apparatus of the integrated circuit package system 100, in an embodiment of the present invention, is performed as follows:

Providing a first integrated circuit die.

Attaching a second integrated circuit die over the first integrated circuit die and offset from the first integrated circuit die in substantially one dimension.

Forming an interdie layer over the second integrated circuit die.

Forming an interconnect near the interdie layer.

Attaching a third integrated circuit die over the interdie layer and substantially aligned to the second integrated circuit die.

Attaching a fourth integrated circuit die over the third integrated circuit die and offset from the third integrated circuit die in substantially the same magnitude and substantially the opposite direction as the second integrated circuit die to the first integrated circuit die.

Thus, it has been discovered that the integrated circuit package system method and apparatus of the present invention furnish important and heretofore unknown and unavailable solutions, capabilities, and functional aspects. The resulting processes and configuration are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   a first integrated circuit die having an interconnect proximal side;
   a second integrated circuit die over the first integrated circuit die, the second integrated circuit die having an interconnect distal side and an interconnect proximal side offset in a first direction from the interconnect proximal side of the first integrated circuit die;
   an interdie layer over the second integrated circuit die;

a third integrated circuit die over the interdie layer, the third integrated circuit die having an interconnect proximal side aligned with the interconnect distal side of the second integrated circuit die, and the interdie layer is recessed from the interconnect proximal side of the second integrated circuit die and the interconnect proximal side of the third integrated circuit die;

a fourth integrated circuit die over the third integrated circuit die, the fourth integrated circuit die having an interconnect proximal side offset in a second direction from the interconnect proximal side of the third integrated circuit die with the second direction opposite to the first direction, wherein the first, second, third, and fourth integrated circuit dies are a same size;

a lower interconnect connected to an upper surface near the interconnect proximal side of the first integrated circuit die and an upper surface near the interconnect proximal side of the second integrated circuit die;

an upper interconnect connected to an upper surface near the interconnect proximal side of the third integrated circuit die and an upper surface near the interconnect proximal side of the fourth integrated circuit die; and a single package encapsulant in direct contact with the first integrated circuit die, the second integrated circuit die, the third integrated circuit die, the fourth integrated circuit die, and the interdie layer.

2. The system as claimed in claim 1 wherein:
the second integrated circuit die having the interconnect proximal side of the second integrated circuit die offset in a first direction is offset a first distance; and
the fourth integrated circuit die having the interconnect proximal side offset in a second direction is offset a second distance and the second distance is the same as the first distance.

3. The system as claimed in claim 1 wherein the lower interconnect has a loop height higher than a height of the second integrated circuit die.

4. The system as claimed in claim 1 wherein:
the single package encapsulant encapsulates the first, second, third, and fourth integrated circuit dies.

5. The system as claimed in claim 1 wherein the lower interconnect is partially within the interdie layer.

6. The system as claimed in claim 1 wherein the first, second, third, and fourth integrated circuit dies have active surfaces facing in a same direction.

7. The system as claimed in claim 6 further comprising a lower die stack having at least three dies including the first integrated circuit die and the second integrated circuit die.

8. The system as claimed in claim 6 further comprising:
a substrate having the first integrated circuit die attached thereto; and
wherein:
the lower interconnect connects the substrate to the first integrated circuit die.

9. The system as claimed in claim 6 wherein the interdie layer includes planar dimensions less than planar dimensions of the second integrated circuit die.

10. The system as claimed in claim 6 wherein the interdie layer includes the lower interconnect embedded partially within the interdie layer.

11. A method of manufacturing an integrated circuit package system comprising:
providing a first integrated circuit die having an interconnect proximal side;
attaching a second integrated circuit die over the first integrated circuit die, the second integrated circuit die having an interconnect distal side and an interconnect proximal side offset in a first direction from the interconnect proximal side of the first integrated circuit die;
forming an interdie layer over the second integrated circuit die;
attaching a third integrated circuit die over the interdie layer, the third integrated circuit die having an interconnect proximal side aligned with the interconnect distal side of the second integrated circuit die, and the interdie layer is recessed from the interconnect proximal side of the second integrated circuit die and the interconnect proximal side of the third integrated circuit die;
attaching a fourth integrated circuit die over the third integrated circuit die, the fourth integrated circuit die having an interconnect proximal side offset in a second direction from the interconnect proximal side of the third integrated circuit die with the second direction opposite from the first direction wherein the first, second, third, and fourth integrated circuit dies are a same size and have active surfaces facing in a same direction;
connecting a lower interconnect to an upper surface near the interconnect proximal side of the first integrated circuit die and an upper surface near the interconnect proximal side of the second integrated circuit die;
connecting an upper interconnect to an upper surface near the interconnect proximal side of the third integrated circuit die and an upper surface near the interconnect proximal side of the fourth integrated circuit die; and
forming a single package encapsulant in direct contact with the first integrated circuit die, the second integrated circuit die, the third integrated circuit die, the fourth integrated circuit die, and the interdie layer.

12. The method as claimed in claim 11 wherein:
attaching the second integrated circuit die includes attaching the second integrated circuit die offset a first distance; and
attaching the fourth integrated circuit die includes attaching the fourth integrated circuit die offset a second distance and the second distance is the same as the first distance.

13. The method as claimed in claim 11 wherein connecting the lower interconnect includes connecting the lower interconnect having a loop height higher than a height of the second integrated circuit die.

14. The method as claimed in claim 11 wherein:
forming the single package encapsulant includes encapsulating the first, second, third, and fourth integrated circuit dies.

15. The method as claimed in claim 11 wherein connecting the lower interconnect includes connecting the lower interconnect partially within the interdie layer.

16. The method as claimed in claim 11 further comprising forming a lower die stack having at least three dies including the first integrated circuit die and the second integrated circuit die.

17. The method as claimed in claim 11 further comprising:
attaching the first integrated circuit die to a substrate; and
wherein:
connecting the lower interconnect includes connecting the lower interconnect to the substrate from the first integrated circuit die.

18. The method as claimed in claim 11 wherein forming the interdie layer includes forming the interdie layer having planar dimensions less than planar dimensions of the second integrated circuit die.

19. The method as claimed in claim 11 wherein forming the interdie layer includes embedding the lower interconnect partially within the interdie layer.

* * * * *